United States Patent [19]

Aldridge et al.

[11] 4,424,494
[45] Jan. 3, 1984

[54] AUTOMATIC GAIN CONTROL CIRCUIT
[75] Inventors: Fredrick A. Aldridge, Russiaville; Burtron D. Schertz, Kokomo, both of Ind.
[73] Assignee: General Motors Corporation, Detroit, Mich.
[21] Appl. No.: 331,662
[22] Filed: Dec. 17, 1981
[51] Int. Cl.³ .............................................. H03G 3/10
[52] U.S. Cl. .................................. 330/278; 330/285; 330/281
[58] Field of Search ..................... 330/278, 281, 285
[56] References Cited
U.S. PATENT DOCUMENTS
4,001,694  1/1977  Grundy et al. .................... 330/285

Primary Examiner—James B. Mullins
Assistant Examiner—Gene Wan
Attorney, Agent, or Firm—A. F. Duke

[57] ABSTRACT

An automatic gain control circuit is disclosed which is direct coupled to phase opposed outputs of an IF amplifier and provides a DC control voltage for controlling the gain of the amplifier. The AGC circuit includes a peak-to-peak threshold detector and an integrating capacitor. The quiescent voltage across the capacitor is accurately established by a voltage divider network and a feedback network. Separate current sources are provided to establish dual time constants in the circuit so that distortion is minimized while accommodating a stop on station feature.

5 Claims, 2 Drawing Figures

U.S. Patent       Jan. 3, 1984       4,424,494 ded in the following detailed description of a
AUTOMATIC GAIN CONTROL CIRCUIT

FIELD OF THE INVENTION

This invention relates to automatic gain control (AGC) circuits and, more particularly, to an AGC circuit which provides an accurately defined start-up voltage.

BACKGROUND OF THE INVENTION

In certain receivers it is important for the AGC circuit to exhibit an accurate start-up voltage because the AGC control voltage is used as a reference in other portions of the receiver. For example, in U.S. Pat. No. 4,198,603 (Aldridge et al), assigned to the assignee of the present invention, the degree of attentuation of the audio output signal is controlled by the AGC voltage. Also, the stop on station feature of many receivers provides automatic selection of signals above a predetermined signal strength by comparing the AGC control voltage with an external reference. One of the problems with the prior art AGC circuitry is the unpredictability of the start-up voltage.

Another problem associated with the stop on station feature occurs when this feature is incorporated in an electronically tuned receiver (ETR). In such receivers, the channel changes are accomplished electronically and, therefore, occur at a very rapid rate. The AGC control voltage should exhibit a long time constant or slow response to signal strength changes in order to minimize distortion. However, with a long time constant it is likely that, if the receiver is tuned to a strong station when the stop on station mode is initiated, relatively weaker stations will be skipped even though such weaker stations meet the signal strength criteria. This problem has been attacked in the prior art by dual time constant circuits which involve switching different size capacitors in the circuit. This approach carries a substantial cost penalty.

SUMMARY OF THE INVENTION

In view of the above, it is an object of the present invention to provide an AGC circuit which provides a stable start-up voltage.

It is another object of the present invention to provide an AGC circuit including an inexpensive and predictable dual time constant feature.

In accordance with the present invention, an AGC circuit is provided which is direct coupled to the phase opposed outputs of an IF amplifier and responds to the peak-to-peak output of the amplifier. When the output exceeds a predetermined threshold, the voltage on a filter capacitor is reduced and reduces the gain of the IF amplifier. The circuit produces an accurate start-up voltage by a resistor divider network and a feedback network which establishes the quiescent output voltage of the circuit. The filter capacitor is quickly charged from a separate current source to provide a "fast" AGC when a stop on station mode is initiated.

BRIEF DESCRIPTION OF THE DRAWINGS

Other objects and features of the invention will become apparent to those skilled in the art as the disclosure is made in the following detailed description of a preferred embodiment of the invention as illustrated in the accompanying sheet of drawing in which.

DESCRIPTION OF THE PREFERRED EMBODIMENT

Figure 1:
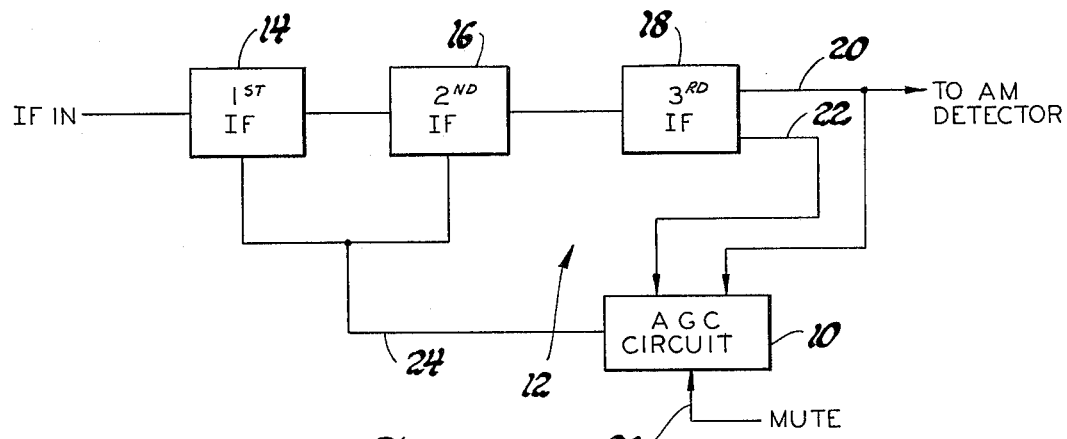
FIG. 1 is a block diagram showing the interconnection of the AGC circuit of the present invention with an IF amplifier.

Referring now to the drawings, and initially to FIG. 1, the AGC circuit of the present invention is generally designated 10 and is connected in a feedback loop between the output and input stages of an IF amplifier generally designated 12. The amplifier 12 comprises first, second and third stages 14, 16 and 18, respectively. The third IF stage 18 preferably includes a differential amplifier which is operated at a fixed gain and which provides push/pull output signals on conductors 20 and 22. One of the outputs 20 may be connected to an AM detector (not shown). The circuit 10 produces a DC output on conductor 24 which is applied to stages 14 and 16 to control the gain of the amplifier 12 thereby limiting the output level of the amplifier 12 within prescribed limits in the presence of widely varying input signal strengths. The circuit 10 also receives an input from a mute line 26 for a purpose which will be described more fully hereinafter.

Figure 2:
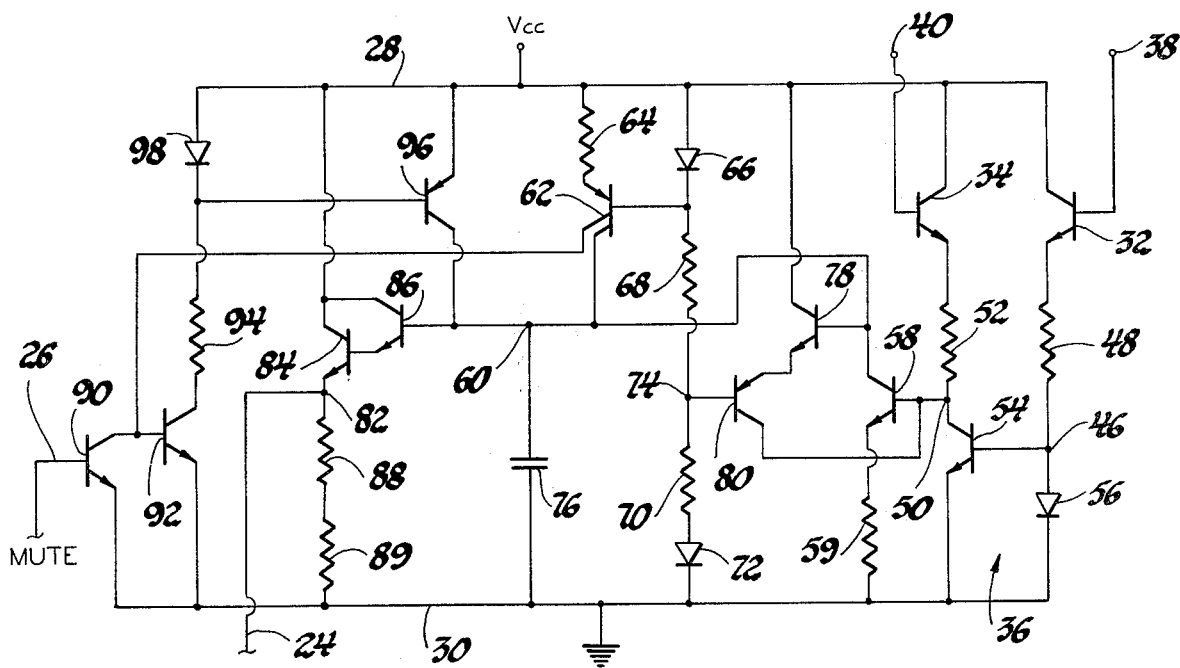
FIG. 2 is a detailed schematic diagram of the AGC circuit.

Referring now to FIG. 2, the circuit 10 is preferably a part of an integrated circuit including the amplifier 12 as well as other receiver circuit components. The circuit 10 includes supply terminals 28 and 30 across which a regulated voltage $V_{cc}$, of for example 8 volts DC, is applied. The circuit 10 includes a peak-to-peak voltage detector comprising a pair of transistors 32 and 34 and a current mirror generally designated 36. The transistors 32 and 34 are biased and driven from the third IF stage 18. Input nodes 38 and 40 of the circuit 10 are connected, respectively, with conductors 20 and 22. The transistors 32 and 34 have their bases connected with the input nodes 38 and 40, respectively, and are driven by the phase opposed or push/pull outputs of the third IF stage 18. The emitter of transistor 32 is connected to an input node 46 of the current mirror 36 through a resistor 48. The emitter of transistor 34 is connected to an output node 50 of the current mirror 36 through a resistor 52. The resistor 52 is approximately 10% larger than the resistor 48 to establish a known offset and thereby fix a desired maximum peak-to-peak amplitude of the IF output signal at, for example, one volt. The current mirror 36 comprises a transistor 54 and a diode connected transistor 56. As is well-known, the transistor 54 will be able to sink a current approximately equal to that flowing through the resistor 48 and the collector lead of the diode connected transistor 56. A transistor 58 has its base electrode connected with the output node 50 of the current mirror 36, its emitter connected to ground through current limiting resistor 59, and its collector connected to a node 60.

A current source connected with the node 60 comprises a transistor 62, a resistor 64 and a diode connected transistor 66. A voltage divider network comprising diode connected transistors 66 and 72 and resistors 68 and 70 is connected across $V_{cc}$ and establishes a reference voltage at a reference node 74. As is well known, resistor ratios can be defined with great accuracy in monolithic integrated circuit manufacture. Thus, the voltage at node 74 which is a function of the ratio of resistors 68 and 70 can be established with accuracy and repeatability. A capacitor 76 is connected between the node 60 and ground. The node 60 is connected with the reference node 74 through the emitter-diode paths of transistors 78 and 80 and with an output node 82 of the circuit 10 through the emitter-diode paths of Darlington connected transistors 84 and 86. The output node 82 of the circuit 10 is connected to the conductor 24 and also to the supply terminal 30 through resistors 88 and 89. The capacitor 76 may be relatively small due to the high impedance of the node 60.

Under quiescent (no signal) conditions, the voltages at the emitters of transistors 32 and 34 are equal and since the resistor 52 is larger than the resistor 48, all the current through the resistor 52 flows through the transistor 54. The capacitor 76 charges until the voltage at the node 60 rises $2V_{be}$ above the voltage at the reference node 74, whereupon the transistors 78 and 80 are biased on and the transistor 80 conducts current to the node 50. The transistor 80 supplies just enough drive current to the base of transistor 58 to maintain the collector voltage of transistor 58 (node 60) at $2V_{be}$ above the voltage at the reference node 74 under these no signal conditions. The voltage at the output node 82 is $2V_{be}$ below the voltage at the node 60 and is, therefore, equal to the voltage at the reference node 74 and is thermally compensated by the cancelling effects of the $V_{be}$'s of the transistors 78,80 and 84,86.

When an IF signal is present at the output of amplifier 12, phase opposed signals are applied to the base of transistors 32 and 34 and thus to the resistors 48 and 52. The peak-to-peak voltage of this IF signal is limited to a predetermined value, such as one volt, by turning on the transistor 58 at the IF frequency to reduce the voltage across the capacitor 76. The transistor 58 will be driven on whenever the current flow through the resistor 52 is greater than the current flow through the resistor 48 since transistor 50 can only sink the amount of current flowing through the resistor 48. The relative values of the resistors 48 and 52 establish the peak-to-peak voltage required to turn on the transistor 58. With the transistor 58 switching at the IF frequency, the voltage at the node 60 and, consequently, at the output node 82 decreases thereby decreasing the gain of the IF stages 14 and 16 to limit the peak-to-peak output of the stage 18 to the desired maximum peak-to-peak voltage. As the voltage at the node 60 is reduced, the emitters of transistors 78 and 80 are pinched-off and the transistor 80 no longer supplies current to the node 50.

The time constant of the circuit 10, as thus far described, is a function of the current available from the current source 62, 64, 66 and is relatively long in order to prevent distortion. However, as previously indicated, a long time constant is undesirable under certain circumstances such as when entering the stop on station mode of the ETR receiver. In order to provide a "fast" AGC, an additional current of approximately 20 times the current available from source 62, 64, 66 is supplied to the node 60 whenever a station change is demanded as indicated by the mute line 26 switching from high to low. This switching causes a transistor 90, which is normally on, to be switched off allowing current from a second collector of transistor 62 to turn on a transistor 92. Transistor 92 saturates and provides a ground path for a resistor 94 causing a current mirror comprising transistor 96 and diode connected transistor 98 to supply current to the node 60. The current supplied by the transistor 96 quickly charges the capacitor 76 thereby raising the voltage at the output node 82 and quickly establishing the maximum gain of the amplifier 12.

The embodiments of the invention in which an exclusive property or privilege is claimed are defined as follows:

1. An AGC circuit having first and second input terminals for receiving a differential input and having an output terminal, said circuit comprising a current source, a capacitor coupled to said current source, a transistor having its emitter-collector path connected in parallel with said capacitor, voltage divider means establishing a reference voltage at a reference node, means responsive to the voltage at said reference node for forward biasing said transistor to establish a substantially constant quiescent voltage across said capacitor related to said reference voltage, means applying the voltage across said capacitor to said output terminal, threshold detecting means connected between said first and second input terminal and the base of said transistor and responsive to said differential input for switching said transistor at the frequency of said input whenever the peak-to-peak voltage of said input reaches a predetermined value to thereby vary the voltage at said output terminal.

2. An AGC circuit having first and second input terminals for receiving a differential input and having an output terminal, said circuit comprising a first current source, a capacitor coupled to said current source, a transistor having its emitter-collector path connected in parallel with said capacitor, voltage divider means establishing a reference voltage at a reference node, means responsive to the voltage at said reference node for forward biasing said transistor to establish a substantially constant quiescent voltage across said capacitor related to said reference voltage, means applying the voltage across said capacitor to said output terminal, threshold detecting means connected between said first and second input terminal and the base of said transistor and responsive to said differential input for switching said transistor at the frequency of said input whenever peak-to-peak voltage of said input reaches a predetermined value to thereby vary the voltage at said output terminal, a second current source connected with said capacitor and capable of supplying substantially greater current than said first current source, means responsive to a mute signal for activating said second current source to quickly charge said capacitor.

3. An AGC circuit providing a DC voltage at an output node thereof for application to an amplifier to limit the peak-to-peak output voltage of the amplifier to a desired maximum value, said circuit including first and second input nodes adapted to be direct coupled to first and second phase opposed output signals of said amplifier, said circuit comprising first and second transistors having a control electrode coupled to said first and second input node, respectively, a current mirror, a first resistor connecting the primary current conducting path of said first transistor to an input node of said current mirror, a second resistor connecting the primary current conducting path of said second transistor to an output node of said current mirror, said second resistor being of greater value than said first resistor by an amount which is related to said desired maximum peak-to-peak voltage, voltage divider means establishing a reference voltage at a reference node, a capacitor, a current source, a third transistor having a primary current conducting path connected in series with said current source and in parallel with said capacitor and having a control electrode connected with the output node of said current mirror, means responsive to the voltage at said reference node for biasing said third transistor to establish a substantially constant quiescent voltage across said capacitor related to said reference voltage, buffer means coupling the voltage across said capacitor to the output node of said circuit, said third transistor being switched at the frequency of said output signal of said amplifier whenever the peak-to-peak voltage of said output signal of said amplifier reaches said desired maximum, thereby reducing the voltage across said capacitor and, consequently, the gain of said amplifier.

4. An AGC circuit providing a DC voltage at an output node thereof for application to an amplifier to limit the peak-to-peak output voltage of the amplifier to a desired maximum value, said circuit including first and second input nodes adapted to be direct coupled to first and second phase opposed output signals of said amplifier, said circuit comprising first and second transistors having a control electrode coupled to said first and second input node, respectively, a current mirror, a first resistor connecting the primary current conducting path of said first transistor to an input node of said current mirror, a second resistor connecting the primary current conducting path of said second transistor to an output node of said current mirror, said second resistor being of greater value than said first resistor by an amount which is related to said desired maximum peak-to-peak voltage, voltage divider means establishing a reference voltage at a reference node, a capacitor, a current source, a third transistor having a primary current conducting path connected in series with said current source and in parallel with said capacitor and having a control electrode connected with the output node of said current mirror, means responsive to the voltage at said reference node for biasing said third transistor to establish a substantially constant quiescent voltage across said capacitor related to said reference voltage, buffer means coupling the voltage across said capacitor to the output node of said circuit, said third transistor being switched at the frequency of said output signal of said amplifier whenever the peak-to-peak voltage of said output signal of said amplifier reaches said desired maximum, thereby reducing the voltage across said capacitor and, consequently, the gain of said amplifier, means including a second current source for quickly charging said capacitor to said quiescent voltage and establish maximum gain of said amplifier in response to a discrete input signal.

5. An AGC circuit providing a DC voltage for limiting the peak-to-peak output voltage of an amplifier to a predetermined value, said amplifier having first and second output nodes said circuit including first and second supply nodes adapted to receive an operating voltage, an output node for providing said DC voltage, and first and second input nodes adapted to be direct coupled to said first and second output nodes of said amplifier to receive first and second phase opposed input signals from said amplifier, said circuit further comprising first and second transistors having base electrodes responsive to said first and second input signals, respectively, and collector electrodes connected with one of said supply nodes, first and second resistors of unequal value having one side connected with the emitter electrodes of said first and second transistors, respectively, a current mirror having a common node connected to the other supply node, an input node connected with the other side of said first resistor and an output node connected with the other side of said second resistor, a current source, a third transistor having its emitter connected with said other supply node, its base connected with the output node of said current mirror and its collector connected with said current source, voltage divider means establishing a reference voltage at a reference node, fourth and fifth transistors having base electrodes connected with said reference node and the collector of said third transistor, respectively, and their emitter electrodes connected one to the other, the collector of said fifth transistor being connected with said one supply node, the collector of said fourth transistor connected with the base of said third transistor, a capacitor connected between said current source and said other supply node whereby the voltage across said capacitor under quiescent conditions is offset by a fixed amount from said reference voltage, and buffer means coupling the voltage across said capacitor to said output node and cancelling said fixed offset whereby the voltage at said output node under quiescent conditions is equal to said reference voltage.

* * * * *